United States Patent
Chae et al.

(10) Patent No.: US 8,815,047 B2
(45) Date of Patent: Aug. 26, 2014

(54) PLASMA CHEMICAL REACTOR

(75) Inventors: Hwankook Chae, Suwon-si (KR); Dongseok Lee, Yongin-si (KR); Heeseok Moon, Pyeongtaek-si (KR); Kunjoo Park, Suwon-si (KR); Keehyun Kim, Suwon-si (KR); Weonmook Lee, Suwon-si (KR)

(73) Assignee: DMS Co., Ltd., Kyungki-Do (KR)

( * ) Notice: Subject to any disclaimer, the term of this patent is extended or adjusted under 35 U.S.C. 154(b) by 1446 days.

(21) Appl. No.: 12/254,686

(22) Filed: Oct. 20, 2008

(65) Prior Publication Data

US 2009/0129997 A1      May 21, 2009

(30) Foreign Application Priority Data

Nov. 21, 2007   (KR) .................. 10-2007-0118985

(51) Int. Cl.
| | | |
|---|---|---|
| C23C 16/50 | (2006.01) | |
| C23C 16/00 | (2006.01) | |
| C23F 1/00 | (2006.01) | |
| H01L 21/306 | (2006.01) | |
| H01J 37/32 | (2006.01) | |
| C23C 16/505 | (2006.01) | |
| C23C 16/458 | (2006.01) | |

(52) U.S. Cl.
CPC ....... *C23C 16/4583* (2013.01); *H01J 37/32009* (2013.01); *H01J 37/32082* (2013.01); *C23C 16/505* (2013.01)
USPC ..................................... 156/345.51; 118/728

(58) Field of Classification Search
USPC ................. 118/728–732; 156/345.51–345.55
See application file for complete search history.

(56) References Cited

U.S. PATENT DOCUMENTS

| | | | | |
|---|---|---|---|---|
| 5,558,717 | A  * | 9/1996 | Zhao et al. ..................... | 118/715 |
| 6,178,918 | B1 * | 1/2001 | van Os et al. ............. | 118/723 R |
| 2004/0050327 | A1* | 3/2004 | Johnson et al. ............... | 118/715 |
| 2005/0051520 | A1* | 3/2005 | Tanaka ..................... | 219/121.43 |

* cited by examiner

Primary Examiner — Maureen Gramaglia
Assistant Examiner — Tiffany Nuckols
(74) Attorney, Agent, or Firm — IPLA P.A.; James E. Bame

(57) ABSTRACT

A plasma chemical reactor includes a chamber for providing a plasma reaction space, and a cathode assembly coupled at one side to a wall surface of the chamber and supporting a substrate at the other side such that the substrate is positioned at a center inside the chamber, and installed to enable height adjustment such that the substrate can maintain a horizontal state.

4 Claims, 5 Drawing Sheets

US 8,815,047 B2

PLASMA CHEMICAL REACTOR

CROSS REFERENCE

This application claims foreign priority under Paris Convention and 35 U.S.C. §119 to each of Korean Patent Application No. 10-2007-0118985 filed on Nov. 21, 2007 with the Korean Intellectual Property Office.

BACKGROUND OF THE INVENTION

1. Field of the Invention

The present invention relates to a plasma chemical reactor for processing a large size wafer. More particularly, the present invention relates to a plasma chemical reactor in which a balance adjustment unit is installed at an electrode base supporting a lower electrode of a cathode assembly for safely mounting a substrate to maintain the horizontal of the lower electrode by adjusting a height of the balance adjustment unit, thereby being capable of stably safely mounting the substrate on the lower electrode, enhancing a process uniformity of a substrate surface by plasma through maintenance of a precise balance of the substrate, and preventing a distortion or inclination of an etching profile formed in the substrate through an etching process.

2. Description of the Related Art

In general, a large size wafer for a semiconductor integrated circuit device, a glass substrate that is a main part used for a Liquid Crystal Display (LCD) or the like are to form a hyperfine structure of a desired form in a surface and form a complex-structured circuit or thin film layer, by forming several thin film layers in the surface and selectively eliminating only part of the thin film layers. Here, fabrication of thin film is achieved through many processes such as a rinse process, a deposition process, a photolithography process, a plating process, an etching process and the like.

Such a variety of processes are mainly performed within a chamber or reactor furnace that is a processing device that can isolate a wafer or substrate from the external.

Among the processes, particularly, the etching process is a process of eliminating desired materials from a wafer surface through plasma chemical reaction by spraying reaction gas (i.e., $CF_4$, $Cl_2$, HBr and the like) into the chamber or reaction furnace. Because the etching process is a process of forming a minute circuit in a substrate by selecting eliminating a portion not covered with photoresist using a photoresist pattern as a mask, it is of most importance to maintain plasma uniformity over the whole substrate surface, maintain the same etching rate, and maintain a substrate in a precise horizontal state to form an etching profile in a full vertical shape.

Thus, for the purpose of improving process uniformity and avoiding process failure, it is required to install a substrate in an accurate position within a chamber or reaction furnace and to maintain a precise horizontal state.

However, a conventional plasma chemical reactor does not include an adjustment device for precisely adjusting a horizontal state of a lower electrode installed in a cathode assembly and thus, has problems as follows.

First, a substrate cannot be maintained in a horizontal state and thus, is not safely mounted on the lower electrode of the cathode assembly. Also, due to substrate slip, the lower electrode is directly exposed to plasma and arc is generated, thus damaging the substrate.

Second, the lower electrode is unbalanced, thus causing a concern of a gas leakage caused by a deformation of a helium (He) gas pipe installed in the lower electrode to cool the substrate.

Third, plasma is not uniformly formed on a substrate surface, thus remarkably deteriorating process uniformity and also, an etching profile formed in a substrate in an etching process and the like is distorted or inclined, thus generating a process failure.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to provide a plasma chemical reactor for precisely adjusting a horizontal state of a lower electrode installed in a cathode assembly, thus not only being capable of safely mounting a substrate on the lower electrode but also preventing the generation of arc and the damage of the substrate caused by direct exposure of the lower electrode to plasma due to substrate slip.

Another aspect of exemplary embodiments of the present invention is to provide a plasma chemical reactor for preventing helium (He) gas from being leaked from a lower electrode surface because a lower electrode is unbalanced and thus a substrate loaded on the lower electrode is slipped.

A further another aspect of the present invention is to provide a plasma chemical reactor for greatly increasing process uniformity of a substrate by uniformly forming plasma on the whole substrate surface, and minimizing a process failure by preventing a distortion or inclination of an etching profile formed in the substrate in an etching process.

According to one aspect of exemplary embodiments of the present invention, there is provided a plasma chemical reactor. The reactor includes a chamber for providing a plasma reaction space, and a cathode assembly coupled at one side to a wall surface of the chamber and supporting a substrate at the other side such that the substrate is positioned at a center inside the chamber, and installed to enable height adjustment such that the substrate can maintain a horizontal state.

The cathode assembly may include a lower electrode installed within the chamber and safely mounting a substrate, a support body installed at one side of the chamber such that the lower electrode can be positioned at a center within the chamber, and supporting the lower electrode, and a balance adjustment unit supporting the support body and installed to enable height adjustment such that a balance of the lower electrode can be adjusted.

The support body may include a fixing plate coupled to a one-side wall of the chamber, a support bar formed to protrude from a one-side surface of the fixing plate, and an electrode base formed at an end of the support bar and supporting the lower electrode.

A sealing member may be provided at a coupling surface between the fixing plate and the chamber to prevent a leakage of a reaction gas within the chamber.

A bellows may be provided at a coupling surface between the fixing plate and the chamber to prevent a leakage of a reaction gas within the chamber.

The bellows may include support rings each coupled to the fixing plate and the chamber, and a corrugated plate installed between the support rings.

Sealing members each may be provided at a coupling surface between the fixing plate and the support ring and a coupling surface of the chamber and the support ring.

The balance adjustment unit may support a bottom surface of the electrode base and be screw coupled at its lower end part to a lower part of the chamber to enable height adjustment.

An assistance nut may be further coupled to a lower part of the balance adjustment unit such that the balance adjustment unit can be firmly fixed to the chamber.

The balance adjustment unit may be plurally provided at equal interval along an outer circumference of a bottom surface of the electrode base.

The balance adjustment unit may include an adjustment plate formed to protrude from one side of an outer circumference surface of the electrode base and penetrated up/down and screw coupled by an adjustment screw, and a fixing support installed at a wall surface inside the chamber and installed to support a lower end part of the adjustment screw.

The fixing support and adjustment plate each may have bent surfaces at their ends such that the bent surfaces can be matched correspondingly to each other.

The balance adjustment unit may be plurally provided at equal interval along an outer circumference surface of the electrode base such that plasma within the chamber can be uniformly distributed.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION OF THE INVENTION

Exemplary embodiments of the present invention will now be described in detail with reference to the annexed drawings. In the following description, a detailed description of known functions and configurations incorporated herein has been omitted for conciseness.

Figure 1:
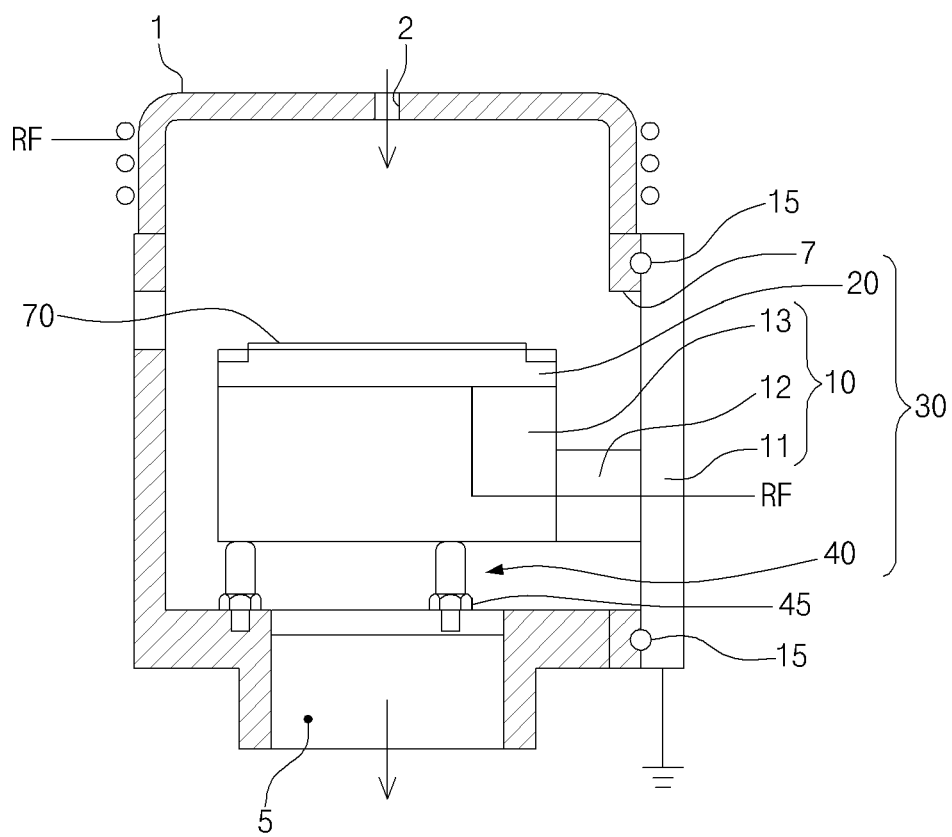
FIG. 1 is a schematic side section diagram of a state in which a cathode assembly is installed in a chamber according to an exemplary embodiment of the present invention.
Figure 2:
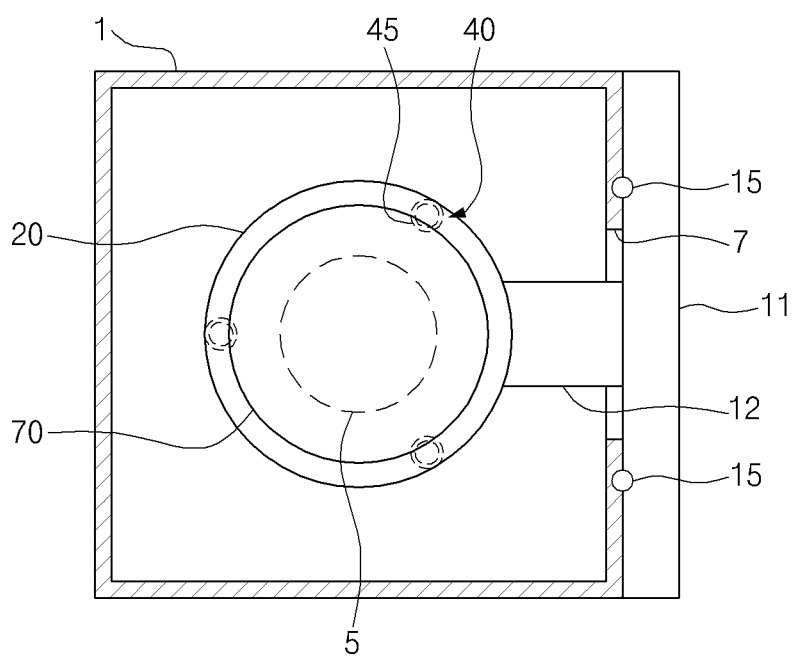
FIG. 2 is a schematic plane section diagram of FIG. 1.

FIG. 1 is a schematic side section diagram of a state in which a cathode assembly is installed in a chamber according to an exemplary embodiment of the present invention. FIG. 2 is a schematic plane section diagram of FIG. 1.

As shown in FIG. 1, an exemplary embodiment of the present invention includes a chamber 1 for providing a plasma reaction space and a cathode assembly 30 installed in the chamber 1.

The chamber 1 has a plasma reaction space. The chamber 1 includes a spray port 2 and an exhaust port 5. The spray port 2 is formed to spray a reaction gas at a center of an upper part of the chamber 1. The exhaust port 5 is formed to exhaust the reaction gas outside at a center of a lower part of the chamber 1.

The cathode assembly 30 supports a substrate 70 such that the substrate 70 can be positioned in a horizontal state within the chamber 1. The cathode assembly 30 includes a lower electrode 20 placing the substrate 70, a support body 10 for supporting the lower electrode 20, and a balance adjustment unit 40 for adjusting a balance (i.e., a horizontal state) of the lower electrode 20.

The lower electrode 20 is a portion for placing the substrate 70 and is positioned at a center inside the chamber 1.

The lower electrode 20 serves as a cathode of a Radio Frequency (RF) source, converts a reaction gas sprayed inside the chamber 1 into a plasma state, and processes a substrate 70 surface by plasma.

The RF source connects to both an upper part of the chamber 1 and the lower electrode 20 and supplies an RF current, thus allowing a conversion of a reaction gas into a plasma state.

In order for plasma to be uniformly formed on the substrate 70 surface, a reaction gas is sprayed inside the chamber 1 through the spray port 2 that is formed at the center of the upper part of the chamber 1 on the same line as a center of the lower electrode 20.

Thus, the reaction gas converts into a plasma state, reacts with the substrate 70 surface, processes the substrate 70, and is exhausted out through the exhaust port 5 formed at the lower part of the chamber 1.

An electrostatic chuck (not shown) can be provided at an upper part of the lower electrode 20 to more stably fix the substrate 70. A gas pipe (not shown) is installed on a top surface of the lower electrode 20 or electrostatic chuck and circulates helium (He) gas to cool the substrate 70.

The electrostatic chuck absorbs a target by electric attraction between an electrode surface and a target using a potential difference of static electricity.

The support body 10 includes a fixing plate 11, a support bar 12, and an electrode base 13.

The fixing plate 11 is coupled to a one-side wall of the chamber 1. In detail, the fixing plate 11 is coupled to a support body insertion hole 7 that is through provided to the one-side wall of the chamber 1.

The fixing plate 11 and the support body insertion hole 7 can be provided in various shapes such as a circular shape, a rectangular shape and the like.

The fixing plate 11 is formed larger than the support body insertion hole 7. The fixing plate 11 is screw coupled to cover the support body insertion hole 7. A sealing member 15 can be provided at a coupling portion between the fixing plate 11 and an outer surface of the chamber 1 to prevent a leakage of a reaction gas.

The sealing member 15 can be an 'O'-ring or pad and the like.

The support bar 12 of a cantilever beam shape supports the electrode base 13. The support bar 12 is formed to protrude by a predetermined length from a one-side surface of the fixing plate 11 such that the electrode base 13 is positioned at a center within the chamber 1.

The electrode base 13 supports the lower electrode 20 and is coupled to an end of the support bar 12.

The electrode base 13 is of a cylindrical shape. The lower electrode 20 is installed at a top of the electrode base 13.

The balance adjustment unit 40 supports a bottom surface of the electrode base 13. The balance adjustment unit 40 not only prevents the electrode base 13 coupled to the end of the support bar 12 from hanging downward by self weight but also serves to adjust a balance of the lower electrode 20, thus being capable of exactly maintaining the horizontal of the lower electrode 20.

The balance adjustment unit 40 is of a rod shape of a predetermined height and has a screw mountain formed on its outer circumference surface of a lower end part, thus being screw coupled to a lower part of the chamber 1.

Thus, the balance adjustment unit 40 precisely adjusts a horizontal state of the electrode base 13 by adjusting screw coupling depth, thus being capable of adjusting a horizontal state of the electrode base 13.

A separate assistance nut 45 can be coupled to a lower part of the balance adjustment unit 40 to adhere and stably fix the balance adjustment unit 40 to the chamber 1.

The assistance nut 45 is screw coupled to the lower part of the balance adjustment unit 40. The assistance nut 45 is rotated to adhere a bottom surface to the chamber 1 with the balance adjustment unit 40 properly adjusted in height, thus being capable of firmly fixing the balance adjustment unit 40 to the chamber 1.

The balance adjustment unit 40 can be provided in plural along an outer circumference of a bottom surface of the electrode base 13.

Thus, adjustment of a balance of the lower electrode 20 is achieved by screw coupling each of the balance adjustment units 40 to the chamber 1 at a proper depth such that the lower electrode 20 is in a horizontal state.

Figure 3:
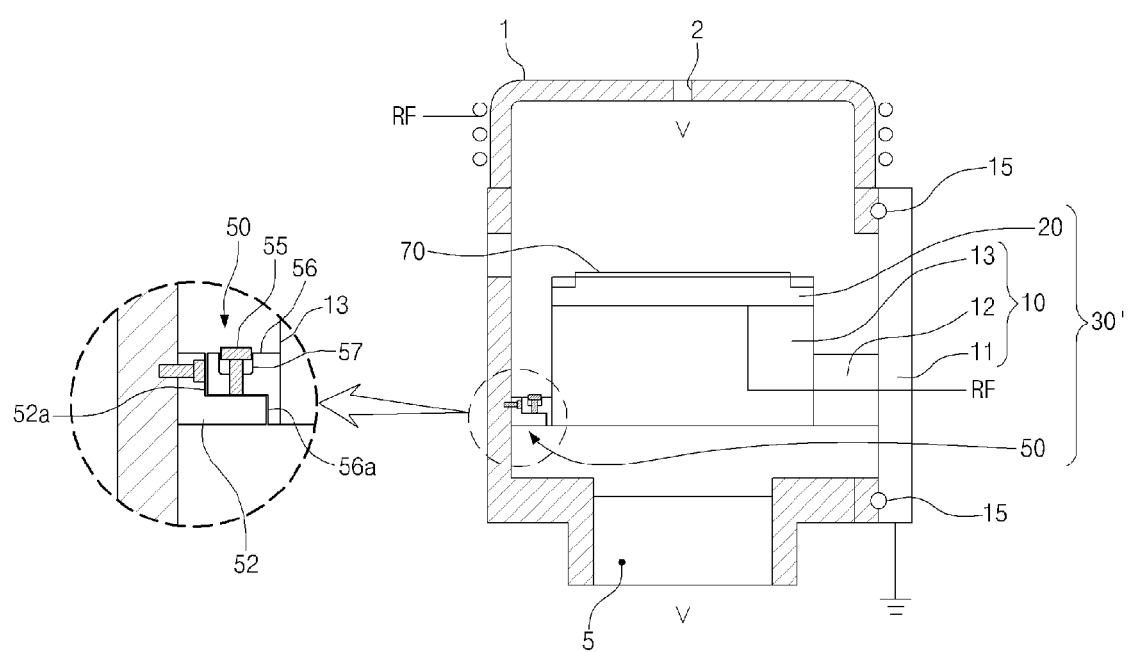
FIG. 3 is a schematic side section diagram of another exemplary embodiment of the present invention.
Figure 4:
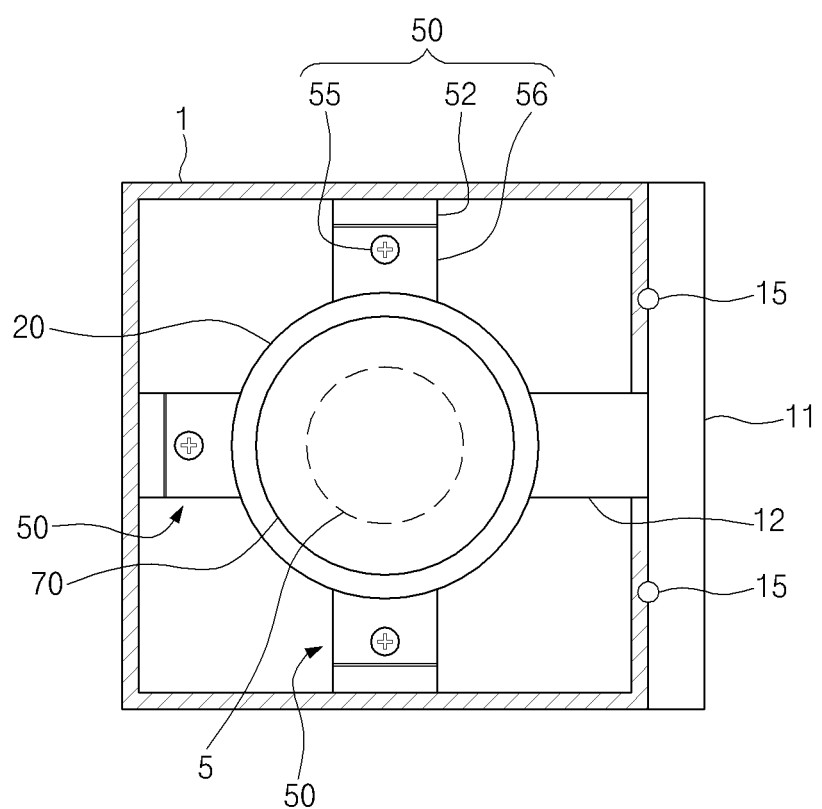
FIG. 4 is a schematic plane section diagram of FIG. 3.

FIGS. 3 and 4 illustrate a plasma chemical reactor in which a balance adjustment unit 50 is provided at a cathode assembly 30' according to another exemplary embodiment of the present invention. FIG. 3 is a schematic side section diagram of another exemplary embodiment of the present invention. FIG. 4 is a schematic plane section diagram of FIG. 3.

FIGS. 3 and 4 show the same construction as FIGS. 1 and 2 except the balance adjustment unit 50 and thus, only a modified construction is described below.

As shown in FIGS. 3 and 4, the balance adjustment unit 50 includes an adjustment plate 56 and a fixing support 52.

The adjustment plate 56 is of a rectangular bar shape. The adjustment plate 56 is formed to protrude from an outer circumference surface of an electrode base 13. The adjustment plate 56 is penetrated up/down and screw coupled at its end by an adjustment screw 55.

An indent groove 57 is provided at a predetermined depth in an upper part of the adjustment plate 56 such that a head part of the adjustment screw 55 can be inserted into the indent groove 57.

A bent surface 56a is formed to have a '┐' shape at a lower part of an end of the adjustment plate 56.

The fixing support 52 is installed in an inner wall surface of the chamber 1 correspondingly to the adjustment plate 56. The fixing support 52 can be fixed to the chamber 1 using a screw and the like.

A bent surface 52a is formed to have a '└' shape corresponding to the bent surface 56a of the adjustment plate 56 at an upper part of an end of the fixing support 52 such that the bent surface 52a can be matched with the bent surface 56a of the adjustment plate 56.

As shown in a magnified diagram of FIG. 3, the fixing support 52 and the adjustment plate 56 are formed such that front end surfaces of the bent surfaces 52a and 56a are spaced a predetermined distance apart and matched with each other to control a position of the adjustment plate 56 in an up/down direction by the rotation of the adjustment screw 55.

Thus, if a support body 10 is coupled to the chamber 1, the bent surface 52a of the fixing support 52 is matched with the bent surface 56a of the adjustment plate 56, so the fixing support 52 supports the adjustment plate 56.

Adjustment of a balance of the lower electrode 20 is achieved by rotating the adjustment screw 55 coupled to the adjustment plate 56 and pressing a lower end part of the adjustment screw 55 to a bottom surface of the bent surface 52a of the fixing support 52, thus relatively moving up the adjustment plate 56 by rotation of the adjustment screw 55 and changing a position of the electrode base 13.

Thus, a balance of a substrate 70 safely mounted on the lower electrode 20 is adjusted.

As shown in FIG. 4, the balance adjustment units 50 can be installed in three positions at equal interval along an outer circumference surface of the electrode base 13, but this does not intend to limit the scope of the present invention and thus the balance adjustment unit 50 can be also plurally installed according to need.

Desirably, the balance adjustment units 50 are provided at equal interval along an outer circumference surface of the electrode base 13 from a support bar 12 of the support body 10 such that a flow of plasma by reaction gas can be uniformly formed within the chamber 1.

Figure 5:
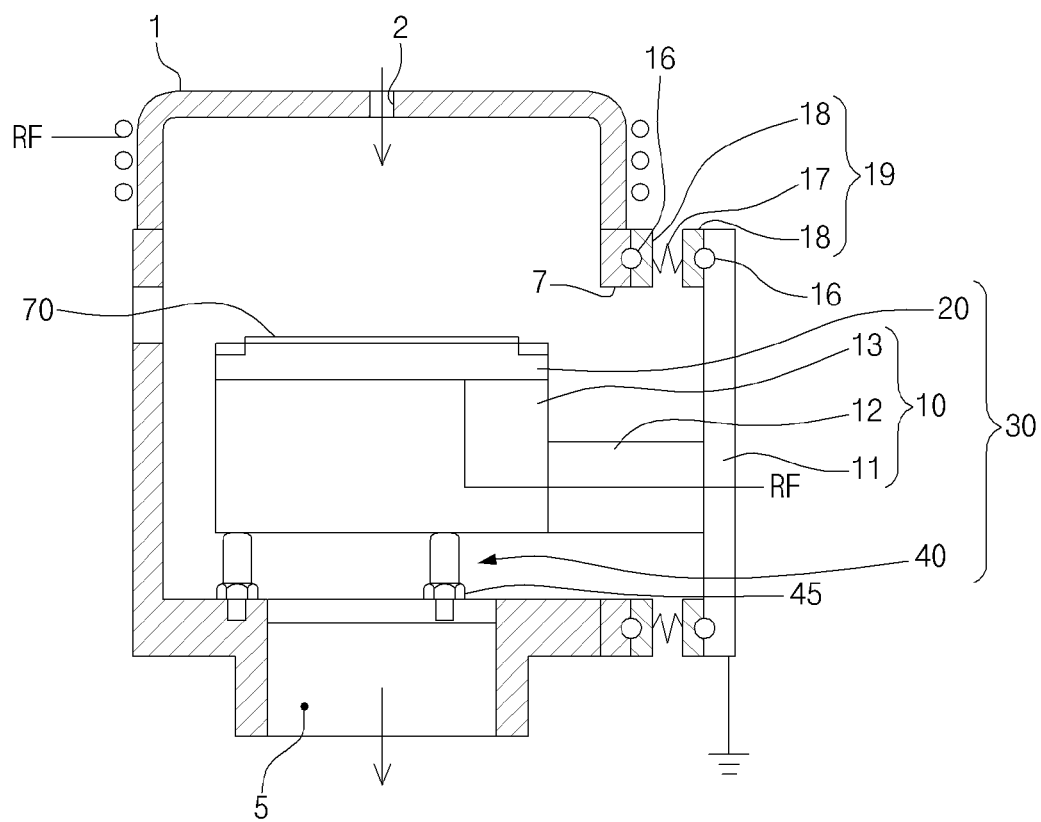
FIG. 5 is a schematic side section diagram of a plasma chemical reactor according to a further another exemplary embodiment of the present invention.

FIG. 5 is a schematic side section diagram of a plasma chemical reactor according to a further another exemplary embodiment of the present invention.

As shown in FIG. 5, a bellows 19 is installed between a fixing plate 11 and a chamber 1.

The bellows 19 is hollow and opened at its both ends. The bellows 19 includes support rings 18 and a corrugated plate 17.

The support rings 18 are of ring shapes installed around a support body insertion hole 7 of the chamber 1 and each are coupled to the fixing plate 11 and a wall surface of the chamber 1.

The corrugated plate 17 has a predetermined elastic force and is installed between the support rings 18 to keep the chamber 1 airtight, thus preventing a leakage of a reaction gas.

When a balance adjustment unit 40 adjusts a position of an electrode base 13, the bellows 19 admits a change of a position of the fixing plate 11 with the elastic force of the corrugated plate 17, thereby more increasing an extent of adjustment of a height of the balance adjustment unit 40 with no leakage of a reaction gas, enabling horizontal movement of a support body 10, and enabling adjustment to position a substrate 70 at a center within the chamber 1.

Sealing members 16 each can be further provided to avoid a leakage of reaction gas at a coupling surface between the fixing plate 11 and the support ring 18 and a coupling surface between the chamber 1 and the support ring 18.

The bellows 19 can be applied even to an exemplary embodiment of the present invention of FIG. 3. The bellows 19 can have a cylindrical shape, a rectangular tank shape or the like corresponding to shapes of the support body insertion hole 7 and fixing plate 11.

Thus, a plasma chemical reactor according to an exemplary embodiment of the present invention can precisely adjust a horizontal state of a lower electrode 20 supporting a substrate 70, thus safely mounting the substrate 70 in an exact position on the lower electrode 20 and preventing slip generation and the like. Therefore, the plasma chemical reactor can prevent a damage of the substrate 70 caused by direct exposure of the lower electrode 20 to plasma and generation of arc, maintain plasma uniformity at a substrate 70 surface, and greatly increase process uniformity of the substrate 70.

The above exemplary embodiments are described merely for example for description convenience and thus do not intend to limit the scope of the present invention, and are all applicable even to a plasma processing equipment such as a Chemical Vapor Deposition (CVD) equipment.

As described above, first, an exemplary embodiment of the present invention has an effect of being capable of stably safely mounting a substrate in an exact position on a lower electrode by maintaining a precise horizontal state of a lower electrode of a cathode assembly, and being capable of minimizing a damage of a substrate and maximizing a process efficiency by preventing arc from being generated due to direct exposure of a lower electrode to plasma caused by substrate slip and the like.

Second, an exemplary embodiment of the present invention has an effect of being capable of preventing a process failure from occurring because helium (He) gas is leaked out due to slip of a substrate loaded on the lower electrode caused by sag of the lower electrode.

Third, an exemplary embodiment of the present invention has an effect of being capable of greatly increasing a process uniformity by maintaining uniformity of plasma at a substrate surface, and being capable of minimizing a process failure and greatly improving process quality and productivity by preventing a distortion or inclination of an etching profile formed in a substrate in an etching process.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A plasma chemical reactor comprising:
a chamber for providing a plasma reaction space; and
a cathode assembly coupled at one side to a wall surface of the chamber and supporting a substrate at the other side such that the substrate is positioned at a center inside the chamber, and installed to enable height adjustment such that the substrate can maintain a horizontal state,
wherein the wall surface of the chamber is substantially perpendicular to a horizontal direction of the horizontal state of the substrate,
wherein the cathode assembly comprises:
a lower electrode installed within the chamber and safely mounting a substrate;
a support body installed at one side of the chamber such that the lower electrode can be positioned at a center within the chamber, and supporting the lower electrode; and
a balance adjustment unit supporting the support body and installed to enable height adjustment such that a balance of the lower electrode can be adjusted,
wherein the balance adjustment unit supports a bottom surface of the electrode base and is screw coupled on a circumference surface of its lower end part to a lower part of the chamber to enable height adjustment,
wherein the balance adjustment unit is plurally provided at equal interval along an outer circumference of a bottom surface of the electrode base.

2. The reactor of claim 1, wherein the support body comprises:
a fixing plate coupled to a one-side wall of the chamber;
a support bar formed to protrude from a one-side surface of the fixing plate; and
an electrode base formed at an end of the support bar and supporting the lower electrode.

3. The reactor of claim 2, wherein a sealing member is provided at a coupling surface between the fixing plate and the chamber to prevent a leakage of a reaction gas within the chamber.

4. The reactor of claim 1, wherein an assistance nut is further coupled to a lower part of the balance adjustment unit such that the balance adjustment unit can be firmly fixed to the chamber.

* * * * *